United States Patent
Spreitzer et al.

(10) Patent No.: US 7,252,781 B2
(45) Date of Patent: Aug. 7, 2007

(54) SOLUTIONS OF POLYMER SEMICONDUCTORS

(75) Inventors: Hubert Spreitzer, Viernheim (DE); Heinrich Becker, Glashütten (DE); Willi Kreuder, Mainz (DE); Sybille Berg, Bodenheim (DE); Andreas Sauer, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 464 days.

(21) Appl. No.: 10/487,665

(22) PCT Filed: Aug. 22, 2002

(86) PCT No.: PCT/EP02/09382

§ 371 (c)(1), (2), (4) Date: Apr. 19, 2004

(87) PCT Pub. No.: WO03/019694

PCT Pub. Date: Mar. 6, 2003

(65) Prior Publication Data

US 2004/0206939 A1 Oct. 21, 2004

(30) Foreign Application Priority Data

Aug. 24, 2001 (DE) .............................. 101 41 624

(51) Int. Cl.
*C08K 5/01* (2006.01)

(52) U.S. Cl. .................. 252/77; 524/476; 524/570

(58) Field of Classification Search ................. None
See application file for complete search history.

(56) References Cited

U.S. PATENT DOCUMENTS

| 4,025,463 | A | * | 5/1977 | Trevoy | 252/500 |
|---|---|---|---|---|---|
| 5,160,457 | A | * | 11/1992 | Elsenbaumer | 252/500 |
| 5,232,631 | A | * | 8/1993 | Cao et al. | 252/500 |
| 5,278,213 | A | * | 1/1994 | Han et al. | 524/233 |
| 5,281,363 | A | * | 1/1994 | Shacklette et al. | 252/500 |
| 5,618,469 | A | | 4/1997 | Harlev et al. | |
| 5,624,605 | A | * | 4/1997 | Cao et al. | 252/500 |
| 6,312,971 | B1 | * | 11/2001 | Amundson et al. | 438/99 |
| 6,313,288 | B1 | * | 11/2001 | Shimada et al. | 540/140 |
| 6,524,761 | B2 | * | 2/2003 | Shimada et al. | 430/59.5 |
| 6,621,098 | B1 | * | 9/2003 | Jackson et al. | 257/40 |
| 6,994,893 | B2 | * | 2/2006 | Spreitzer et al. | 427/469 |
| 7,095,044 | B2 | * | 8/2006 | Brown et al. | 257/40 |
| 2002/0007056 | A1 | * | 1/2002 | Shimada et al. | 540/124 |
| 2002/0038999 | A1 | * | 4/2002 | Cao et al. | 313/503 |
| 2004/0225056 | A1 | * | 11/2004 | Spreitzer et al. | 524/570 |

FOREIGN PATENT DOCUMENTS

| DE | 3625154 | 1/1988 |
|---|---|---|
| EP | 0 690 457 | 1/1996 |
| WO | WO-01/16251 | 3/2001 |

OTHER PUBLICATIONS

Gray et al., "Screen Printed Organic Thin Film Transistors (OTFTs) on a Flexible Substrate", Proceedings of SPIE, vol. 4466, pp. 89-94 (2001).
Speakman et al., "High performance organic semiconducting thin films: Ink jet printed polythiophene [rr-P3HT]", Organic Electronics, vol. 2, pp. 65-73 (2001).

* cited by examiner

*Primary Examiner*—Gregory Webb
(74) *Attorney, Agent, or Firm*—Connolly Bove Lodge & Hutz LLP

(57) ABSTRACT

The present invention relates to a process for producing particle-free solutions of polymeric semiconductors and to their use for producing layers of polymeric semiconductors in polymeric organic light-emitting diodes (PLEDs), organic integrated circuits (O-ICs), organic field effect transistors (OFETs), organic thin film transistors (OTFTs), organic solar cells (O-SCs) or organic laser diodes (O-lasers).

25 Claims, No Drawings

SOLUTIONS OF POLYMER SEMICONDUCTORS

RELATED APPLICATIONS

This application is a Rule 371 application of PCT/EP02/09382 filed on Aug. 22, 2002 which claims benefit to German application 10141 624.5 filed Aug. 24, 2001.

The present invention relates to solutions of polymeric semiconductors and their use in the electronics industry.

In a variety of applications, which in the broadest sense can be considered part of the electronics industry, the use of organic semiconductors as active components (=functional materials) has been reality for some time or is expected in the near future. Thus, charge transport materials based on organic compounds (generally hole transport materials based on triarylamines) have been used in copiers for some years.

The use of specific semiconducting organic compounds, some of which are also capable of emitting light in the visible region of the spectrum, is just beginning to be introduced on the market, for example in organic or polymeric electroluminescence devices.

The use of organic charge transport layers in applications such as organic integrated circuits (organic ICs) and organic solar cells has, at least in the research stage, progressed so far that introduction on the market within the next few years can be expected.

The number of further possibilities is very large, but may frequently only be regarded as modifications of the above-described processes, as the examples of organic solid-state laser diodes and organic photodetectors demonstrate.

In some of these modern applications, development has already progressed a long way, but there is still, depending on the application, a tremendous need for technical improvements.

It can generally be assumed that both low molecular weight organic semiconductors and polymeric organic semiconductors can be suitable for use in many of the above-mentioned possible applications. Depending on the application, one of the two materials variants has particular advantages.

However, it may generally be stated that in the case of applications which require the use of undiluted or virtually undiluted semiconductors, the appropriate coating methods for the low molecular weight or polymeric semiconductors can in principle be distinguished as follows:

Low molecular weight semiconductors are then usually applied in the appropriate layers by vacuum processes. Structuring is carried out by, for example, masking processes. Application by solution processes, e.g. various printing processes, doctor blade coating or spin coating, is generally unsuitable for undiluted low molecular weight semiconductors, since it is frequently necessary to produce amorphous layers, which in the case of these substances seldom succeeds from solution.

Polymeric semiconductors can usually be processed only from solution. Structuring can in this case be carried out by means of the coating process used (e.g. various printing techniques) or by subsequent treatment (e.g. photostructuring) or with the aid of typical photoresist techniques (crosslinking, removal of regions that have not been crosslinked, renewed coating, etc).

An important distinguishing feature when using low molecular weight or polymeric semiconductors is therefore the coating method.

Coating from solution is significantly easier to scale up. While vacuum coating is usually a batch process, a solution process can be operated continuously when using suitable methods, which represents a significant cost advantage and is advantageous for mass production.

It is therefore of great economic importance to provide high-quality solutions of polymeric semiconductors which have a constant quality.

The use and preparation of such solutions has been widely described, but up to now no importance has been attached to the actual preparation of the actual solutions in a manner which can be scaled up. This could be due, in particular, to the fact that a reproducible process has not been sought in most cases, but rather the research use was first priority.

In the prior art which describes use of soluble conjugated polymers, the precise preparation of these solutions is not reported in detail:

EP 443861 describes a soluble PPV derivative (diheptyloxy-PPV) which can be applied from chloroform solution. The device parameters achieved in a PLED examined are totally unsatisfactory; nothing is said about the reproducibility of these results either.

Jpn. J. Appl. Phys. 1989, 28, L1433 analogously describes soluble polyfluorene derivatives. Here too, there is absolutely no information on the preparation of stable solutions.

Analogous information may be found in all of the prior art. Although very good use properties have been reported for solutions of polymeric semiconductors, especially when used in PLEDs, there is virtually no information at all on the reproducibility, availability and stability of the corresponding solutions.

As has been described above, it is therefore of great commercial interest to provide high-quality solutions of polymeric semiconductors which have a constant quality. This is an object of the present invention.

To achieve good processibility, reproducibility and use properties, the following parameters are important:
1. Very constant concentration/viscosity ratio, which can be ensured by a very constant molecular weight (very small batch-to-batch fluctuations).
2. Highly pure solvent.
3. Freedom from dust particles and particles in general.
4. Availability in industrially relevant quantities.
5. Stability of the solution over a relevant period of time.

Point 1 in particular is difficult to achieve in practice. Semiconducting polymers frequently have a high molecular weight (i.e. $M_w$>500 000, sometimes >1 000 000, $M_n$ value>100 000, frequently >250 000) and are obtained, for example, by polymerization (dehydrohalogenation polymerization in the case of poly-p-phenylenevinylenes [PPVs], cf., for example, EP-A-944663) or polycondensation (e.g. Suzuki polymerization in the case of polyfluorenes [PFs], cf., for example, EP-A-1025142). Although these processes can be readily controlled, reproduction of the molecular weight and polydispersity can generally not be readily achieved at will and variations in the range of at least ±5%, sometime about ±10% (cf. example 1) occur.

These fluctuations, which are small per se, then lead, however, to the following problems in the preparation of corresponding solutions:

If, for example, the concentration of the solution is fixed (e.g. 5 g/l) and two polymers whose $M_w$ values differ by about 10% (e.g. 1 500 000 and 1 350 000) are used, two solutions which have a significantly different viscosity (e.g. 25 mPa*s and 18 mPa*s @ 40 s$^{-1}$) are obtained (cf. example 1). The actually relatively small fluctuations in the molecular weight thus lead to significant variations in the parameter which is of critical importance for the use properties of polymer solutions (viscosity or concentration/viscosity ratio).

This has drastic consequences for an industrial process: for solutions which originate from a new polymer batch, the coating parameters have to be completely reset, which at least greatly increases the costs and sometimes also prevents industrial use of the corresponding solutions.

Point 3 is also a nontrivial problem in the case of polymeric semiconductors. As a result of the high molecular weight of the polymers, filtration of the corresponding solutions is not easy. The high molecular weight polymers sometimes form SUPRAMOLECULAR structures (chemical or physical aggregates) in solution, and these increase the size of the already large polymer molecules still further. This leads to the filters used very quickly becoming blocked, which is firstly uneconomical and secondly makes the process either very slow (expensive).or sometimes virtually impossible.

It has surprisingly been found that solutions of polymeric semiconductors which have the abovementioned properties can be prepared simply, efficiently and reproducibly.

The present invention accordingly provides a process for preparing solutions comprising polymeric organic semiconductors, which comprises the steps:
- A) dissolution of at least one polymeric organic semiconductor in a suitable solvent (STARTING SOLUTION),
- B) after-treatment of the STARTING SOLUTION from step A) (SOLUTION),
- C) filtration of the SOLUTION from step B) by means of dead-end filtration and/or crossflow filtration and isolation of the filtered solution comprising at least one polymeric organic semiconductor (FILTERED SOLUTION).

The preparation of the STARTING SOLUTION in step A) is carried out by dissolving at least one polymeric organic semiconductor or a mixture of a plurality of polymeric organic semiconductors (polymer blend), if desired in combination with one or more low molecular weight additives (e.g. dopants to modify the color or conductivity), in the desired solvent or solvent mixture. The STARTING SOLUTION can further comprise dispersion-like constituents. The preparation of the STARTING SOLUTION in step A) is carried out under the action of shear forces, for example by stirring or mixing, if desired with heating. The STARTING SOLUTION is usually optically clear.

The after-treatment of the STARTING SOLUTION in step B) is carried out by means of one or more mechanical after-treatment(s). Examples of suitable mechanical after-treatments are treatment with ultrasound (e.g. ultrasonic bath, ultrasonic probe, flow-through ultrasonic apparatus), treatment with a fast-running, high-shear dispersing stirrer or mechanical treatment using a disintegrator. The treated STARTING SOLUTION is subsequently referred to as SOLUTION.

In step C), the SOLUTION from step B) is filtered. Suitable filtration methods include both dead-end filtration and crossflow filtration, which may also be combined with one another. Further filtration methods can also be employed. These can, depending on the requirement profile to be met by the filtered solution, be employed before or after step C). In this way, higher throughputs can be achieved and blocking of the fine filter can be avoided or reduced. This gives a FILTERED SOLUTION.

If necessary, the FILTERED SOLUTION can be diluted to the desired concentration (+viscosity) by addition of filtered solvent. In this way, the concentration/viscosity ratio can be set in a targeted and reproducible fashion. The addition of filtered solvents or solvent mixtures is advantageously carried out in clean rooms, for example in clean rooms of class 100, in particular class 10.

The solvents or solvent mixtures added have been freed of particles beforehand by filtration. The filters used have at least the same pore size, preferably a smaller pore size, as/than those utilized for step C).

This process has the following advantages:
1. The process can be scaled up and can thus be employed in industry.
2. The process leads to readily reproducible results.
3. The process leads to solutions which, owing to their freedom from particles, are highly suitable for use in typical semiconductor applications (cf. below).
4. As a result of the reproducibility, the use of these solutions is uncomplicated (when changing batches).
5. The process leads to solutions which are stable for a long time (cf. example 6).

In a preferred embodiment of the process of the invention, all process steps take place mostly under an inert atmosphere i.e. they are carried out, for example, under nitrogen or argon.

Preference is also given to carrying out at least the filtration and the optional final addition of solvent in a clean room environment. This helps to avoid subsequent introduction of dust particles.

It is then possible to use solutions of polymeric semiconductors which have been prepared in this way directly for the planned application, i.e. to utilize them directly in an appropriate coating process for the intended use.

Another possibility which is preferred from the point of view of the process sequence, is firstly to package the inventive solutions produced by the process of the invention, to store them if necessary, to transport them to another place and finally to use them only after some time.

It is in this case useful to employ suitable containers which, firstly, preserve the freedom from dust achieved and, secondly, have no other effects on the solutions.

The present invention therefore also provides for dispensing the solutions produced according to the invention into containers suitable for clean-room conditions and then storing and transporting these tightly closed. Dispensing itself is preferably carried out in clean rooms of class 100, in particular class 10.

Such containers are known. Thus, for example, ATMI Packaging, Minneapolis, Minn. 55438 (formerly known as Now Technologies Inc.) markets bottles of various sizes which comprise a strong plastic or metal bottle and have a totally inert insert of, for example, PTFE or PTFE/PFA. Further possibilities are, for example, glass or fused silica bottles which have been washed free of dust.

This dispensing and storage preferably continues to be carried out under an inert gas atmosphere. It can be useful to seal the abovementioned plastic bottles into a further container and to fill this container with an inert gas.

The viscosity of the solutions of the invention is variable. However, certain coating techniques demand the use of particular viscosity ranges. Thus, an appropriate range for coating by ink jet printing (IJP) is from about 4 to 25 mPa*s. However, a significantly higher viscosity, for example in the range from 20 to 500 mPa*s, can be advantageous for other printing methods, e.g. gravure printing processes or screen printing.

The process of the invention can be employed for a large number of polymeric semiconductors. For the purpose of the present invention, polymeric semiconductors are, in general terms, polymeric organic or polymeric organometallic compounds which, in the form of a solid or a compact layer, display semiconducting properties, i.e. in which the energy gap between conduction and valence band is in the range from 0.1 to 4 eV.

For the purposes of the present description, polymeric organic semiconductors are, in particular, (i) the substituted poly-p-arylene-vinylenes (PAVs) which are soluble in organic solvents and are disclosed in EP-A-0443861, WO 94/20589, WO 98/27136, EP-A-1025183, WO 99/24526, DE-A-19953806 and EP-A-0964045, (ii) the substituted polyfluorenes (PFs) which are soluble in organic solvents and are disclosed in EP-A-0842208, WO 00/22027, WO 00/22026, DE-A-19981010, WO 00/46321, WO 99/54385, WO 00/55927, (iii) the substituted polyspirobifluorenes (PSFs) which are soluble in organic solvents and are disclosed in EP-A-0707020, WO 96/17036, WO 97/20877, WO 97/31048, WO 97/39045, (iv) the substituted poly-para-phenylenes (PPPs) which are soluble in organic solvents and are disclosed in WO 92/18552, WO 95/07955, EP-A-0690086, EP-A-0699699, (v) the substituted polythiophenes (PTs) which are soluble in organic solvents and are disclosed in EP-A-1028136, WO 95/05937, (vi) the polypyridines (PPys) which are soluble in organic solvents and are disclosed in T. Yamamoto et al., *J. Am. Chem. Soc.* 1994, 116, 4832, (vii) the polypyrroles which are soluble in organic solvents and are disclosed in V. Gelling et al., *Polym. Prepr.* 2000, 41, 1770, (viii) substituted, soluble copolymers comprising structural units from two or more of the classes (i) to (vii), (ix) the conjugated polymers which are soluble in organic solvents and are disclosed in *Proc. of ICSM '98*, Part I & II (in: *Synth. Met.* 1999, 101+102), (x) substituted and unsubstituted polyvinylcarbazoles (PVKs) as disclosed, for example, in R. C. Penwell et al., *J. Polym. Sci., Macromol. Rev.* 1978, 13, 63-160, and (xi) substituted and unsubstituted triarylamine polymers, preferably those disclosed in JP 2000-072722.

These polymeric organic semiconductors are hereby incorporated by reference into the disclosure of the present invention.

Polymeric organometallic semiconductors are described, for example, in the unpublished patent application DE 10114477.6, e.g. organometallic complexes which have been incorporated into polymers by polymerization.

The polymeric organic semiconductors used according to the invention can also, as described above, be used in doped form or as blends with one another. For the present purposes, doped means that one or more low molecular weight substances are mixed into the polymer; blends are mixtures of more than one polymer which do not necessarily all have to display semiconducting properties.

Likewise, a large number of different solvents are in principle possible for the process of the invention. However, prerequisites for viable industrial use are the following boundary conditions:

1. The solvent or solvent mixture has to be available or at least accessible in sufficient amounts.
2. The solvent or solvent mixture has to be available in a purity appropriate for the application or at least has to be able to be brought to this purity by means of industrially usable processes.
3. The solvent or solvent mixture has to have physical properties suitable for the application (e.g. melting point, boiling point, vapor pressure, viscosity, environmental acceptability, toxicity).

There are many examples of solvents which can be used: aromatic solvents such as substituted benzenes (e.g. toluene, anisole, xylenes), heteroaromatics, e.g. (pyridine and simple derivatives), ethers (e.g. dioxane) and further organic solvents are frequently used.

Solvents specifically for solutions of polymeric semiconductors have also been described in various patent applications.

EP-A-1083775 proposes, in particular, high-boiling aromatic solvents which have a preferred boiling point above 200° C., and are benzene derivatives which possess at least three carbon atoms in the side chain or chains. In the patent application mentioned, solvents such as tetralin, cyclohexylbenzene, dodecylbenzene and the like are mentioned as preferred.

EP-A-1103590 analogously reports solvents in general having a vapor pressure (at the temperature of the coating process) of less than 500 Pa (5 mbar), preferably less than 250 Pa (2.5 mbar) and once again describes solvents or solvent mixtures of mainly (highly) substituted aromatics.

On the other hand, the unpublished patent application DE 10111633.0 mentions solvent mixtures consisting of at least two different solvents of which one boils in the range from 140 to 200° C. In general, solvent mixtures comprising mainly organic solvents such as xylenes, substituted xylenes, anisole, substituted anisoles, benzonitrile, substituted benzonitriles or heterocycles such as lutidine or morpholine are likewise described here. These can be, for example, mixtures of solvents of the group A described below with solvents of group B.

Group A:
o-xylene, 2,6-lutidine, 2-fluoro-m-xylene, 3-fluoro-o-xylene, 2-chlorobenzo-trifluoride, dimethylformamide, 2-chloro-6-fluorotoluene, 2-fluoroanisole, anisole, 2,3-dimethylpyrazine, 4-fluoroanisole, 3-fluoroanisole, 3-trifluoromethylanisole, 2-methylanisole, phenetol, 4-methylanisole, 3-methylanisole, 4-fluoro-3-methylanisole, 2-fluorobenzonitrile, 4-fluoroveratrole, 2,6-dimethylanisole, 3-fluoro-benzonitrile, 2,5-dimethylanisole, 2,4-dimethylanisole, benzonitrile, 3,5-dimethylanisole, N,N-dimethylaniline, 1-fluoro-3,5-dimethoxybenzene or N-methylpyrrolidinone.

Group B:
3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluoro-benzene, p-xylene or m-xylene.

The likewise unpublished German patent application DE 10135640.4 discloses the use of solvents analogous to those mentioned above and, apart from the polymeric semiconductors and the solvents, further additives, preferably siloxane-containing additives.

To carry out the process of the invention, polymeric semiconductors (one or more), e.g. ones selected from the above-described classes, are dissolved in solvents, e.g. solvents selected from among the above-described examples.

For this purpose, the amount of polymer necessary for the desired concentration, if desired somewhat more, is firstly added to the required amount of solvent.

The solutions to be prepared should contain from 0.01 to 20% by weight, preferably from 0.1 to 15% by weight, particularly preferably from 0.25 to 10% by weight, very particularly preferably from 0.25 to 5% by weight, of the polymeric semiconductors. A mixture/blend of more than one polymeric semiconductor can also be used according to the invention.

The solution itself is prepared in a container appropriate for the desired volume. Thus, small amounts (up to about 500 ml) can, for example, be made up without problems in suitable glass or plastic bottles.

Moderate amounts (up to about 20 l) can, for example, be made up in standard laboratory glass or fused silica apparatus.

Larger amounts (from 20 to >1 000 l) have to be made up in suitable plants and suitable rooms because of the hazard potential of organic solvents. These can be, for example, normal vessels for chemical syntheses. However, owing to the high purity requirements, these vessels have to be specially cleaned and have particular internal surfaces. For the production of thin films in particular, contamination with metal particles and ionic impurities should generally be avoided. Preference is therefore given in principle to very smooth and abrasion-resistant container surfaces. It can also be advantageous for no metallic surfaces to come into contact with the solutions.

As indicated above, it is frequently advantageous to carry out the process under an inert atmosphere. Particularly in the case of relatively large quantities, this generally also provides the necessary explosion protection, since very many organic solvents form explosive gas mixtures with air and hazards are therefore difficult to eliminate when working in an ambient atmosphere.

According to the invention, a STARTING SOLUTION is prepared by stirring or mixing and heating.

Stirring or mixing can be carried out by means of a large number of different methods:

It is possible to use, for example, standard stirring apparatuses (e.g. magnetic stirrers, precision glass stirrers, industrial agitators) or pumped circulation mixers (mixing by frequent pumping through an angled tube system). However, mixing can also, for example, be achieved by shaking using an appropriate apparatus. As in the case of the selection of the vessel, care has to be taken to ensure that the solution is not contaminated by the mixing process. Further potential mixing methods may be found, for example, in *Ullmann's Encyclopedia of Industrial Chemistry*, $6^{th}$ Edition, WILEY-VCH, 2001.

Heating can be carried out within a wide temperature range.

This temperature range is usually from room temperature (20° C.) and the boiling point of the solvent (or mixture). It may also be advantageous to work under superatmospheric/subatmospheric pressure and thus extend the range of usable temperatures.

However, a working range from 20 to 100° C., preferably from 40 to 80° C., has been found to be appropriate in practice.

The appropriate period of time depends on a variety of factors, e.g. the desired concentration, the form of the polymer solid, the molecular weight of the polymer, the solvent, the actual temperature selected, the type and power of the stirrer or mixer, the ratio of vessel size to mixture power and further circumstances. However, the period of time will usually be in the range from 0.5 to 100 hours, preferably from 2 to 40 hours, particularly preferably from 2 to 25 hours.

The STARTING SOLUTION obtained in this way is then subjected to mechanical after-treatment. This treatment, which is described in more detail below, is carried out for, inter alia, the following reasons:

STARTING SOLUTIONS of polymeric semiconductors frequently contain not inconsiderable amounts of aggregates. These firstly alter the properties of the semiconductors in the film (e.g. conductivity, color) and secondly, as described above, they make filtration of the respective STARTING SOLUTIONS more difficult since they very easily block the pores and/or channels of the filters used. These aggregates can be completely broken up by the mechanical after-treatment, or their proportion can at least be reduced significantly (cf. example 2).

An important aspect is that the molecular weight of the polymers can be reduced by targeted use of these mechanical processes without having a significant influence on the performance of the material in the application. This can be used very advantageously to compensate for the abovementioned batch fluctuations due to the synthesis. It is in this way also possible to achieve a very reproducible concentration/viscosity ratio (cf. example 1).

Furthermore, the processes for mechanical after-treatment can actually be employed to produce a targeted, relatively large decrease in the molecular weight when, for instance, particular applications or, for example, coating processes impose upper limits on the molecular weight. Such upper limits have been described, for example, for printing processes such as ink jet printing (cf. US-A-2001/0003602). For further details, reference may also be made to example 3.

The mechanical treatment can, inter alia, be carried out as described below. It may be pointed out that not all methods are equally suitable for every batch size. Thus, for example, the use of standard ultrasonic baths for solutions in the 1000 l range is uneconomical, while the use of appropriate flow-through apparatuses can be technically impracticable for small quantities (e.g. <5-20 l) because of the high dead volumes. Nevertheless, with appropriate adaptation, various methods can lead to a similar result.

1. One simple possibility is the use of commercial ultrasonic baths. These are obtainable in various sizes and various power ratings. Important parameters here are volume, ultrasonic power and ultrasonic frequency. The mechanical treatment is carried out by placing the STARTING SOLUTION in a suitable container (e.g. glass vessel, plastic bottle) in the ultrasonic bath and sonicating it for a particular time (which depends essentially on the degree of aggregation or the intended reduction in molecular weight). It can also be found to be advantageous to keep the temperature constant during sonication or keep it below a particular maximum temperature. It can likewise be useful to provide good mixing during sonication so that the ultrasonic power introduced acts homogeneously on the contents of the vessel. Commercially available ultrasonic apparatuses which are suitable for use in this way are, for example, BANDELIN USR 170D (17 l, 2×450 W), BANDELIN RM 75UH (87 l, 2×2000 W), BANDELIN RM 210UH (243 l, 2×4000 W), BANDELIN RK 514BH (19 l, 2×450 W); BANDELIN RK 1050CH (90 l, 2×1200 W), BRANSON 8510 DTH (20 l, 320 W), ELMA TS 820H (18 l, 2×600 W) and further products from the abovementioned or other manufacturers.

2. One or more ultrasonic probes can also be used in an analogous fashion for carrying out the mechanical treatment. In this case, these are generally introduced directly into the STARTING SOLUTION. What has been said under 1 applies analogously here: temperature control and mixing can be advantageous. The time is once again determined mainly by the consistency of the SOLUTION to be achieved. Suitable commercially available ultrasonic probes are, for example, BANDELIN SONOPLUS 2600 (600 W, 20 kHz) and BRANSON SONIFIER 450 DIGI (½") (400 W, 20 kHz) and further products from the abovementioned or other manufacturers. A disadvantage which could be very difficult to avoid when using these probes could be the abraded material (titanium particles) produced at the tips of these probes. However, this abraded material can be completely removed again by subsequent filtration.

3. A further possible way of using ultrasound is provided by various flow-through apparatuses. Thus, there are simple flow-through cells through which the solutions can be pumped and in which, for example, ultrasonic probes are installed. Suitable flow-through cells are obtainable, for example, from BRANSON. Furthermore, there are also flow-through tubes which function in the manner of a tubular ultrasonic bath; an example is the PENTAGONAL system from BRANSON: PENTAGONAL tubular sonicator LP 6.80-35+HF generator B-8540 LP-35 (40 kHz, 3 kW). The use of such apparatuses is firstly advantageous with a view to scaling up such a process, and, secondly, the mechanical effect can sometimes be regulated better, e.g. by selection of the flow rate, than when using simple ultrasonic baths or ultrasonic probes. Otherwise, the remarks made under 1. and 2. apply.

4. A further possibility is the use of high-shear dispersing stirrers, dispersers or high-speed stirrers. These are available in various designs and power ratings. In particular, they can also be used advantageously for larger volumes (>500 l), since these stirrers are available in industrial sizes. In a manner analogous to mechanical treatment with ultrasound, temperature control during the actual dispersing process can also be advantageous here. Suitable stirrers are, for example, HEIDOLPH DIAX 900 (up to 7.5 l, up to 5000 mPa*s, 495 W, 8000-26 000 min$^{-1}$), KINEMATIC POLYTRON series (up to 30 l, up to 1600 W, up to 30 000 min$^{-1}$), IKA ULTRATURRAX series (up to 50 l, up to 1100 W, up to 25 000 min$^{-1}$), MICCRA D series (up to 50 l, up to 1300 W, up to 39 000 min$^{-1}$), various models of YSTRAL, EKATO stirrer (up to 1000 l, 5.5 kW, 95-950 min$^{-1}$) and further products from the abovementioned or other manufacturers.

5. Another possible way of carrying out the mechanical treatment is the use of disintegrators. These usually operate according to the following principle: the STARTING SOLUTION is pushed with the aid of a pump through a microchamber at high pressure (high velocity). As a result of the specific geometry of these chambers, tremendous shear forces are applied to the solution. This achieves ultrasound-like effects (breaking up of aggregates, reduction in the molecular weight). The entire process can be operated with circulation (possibly with continuous further addition and discharge) or be used as a step in a longer process. As in the case of the various ultrasonic methods and with dispersion, temperature control and potential further mixing can be found to be advantageous here. This method in particular is very useful from the point of view of scale-up. Suitable apparatuses are supplied by, for example, MicroFluidics (e.g. MICRO FLUIDIZER PROZESSOR M-110 EH, equipped with 100 µm or 200 µm chamber; the chamber is obtainable, for example, in ceramic or diamond).

The following then applies to the practical implementation of all these mechanical treatment methods described here and also further analogous methods which have not been explicitly listed here:

To obtain a desired concentration/viscosity ratio, a suitable STARTING SOLUTION is prepared first and this is examined to determine the parameters mentioned (concentration, viscosity) (cf. examples). The values of these parameters for the STARTING SOLUTION should preferably be above those desired in the end, since thickening of the solutions is not very practicable industrially and is disadvantageous with regard to particle contamination and, furthermore, when the concentration is correct but the viscosity is too low, there is no way, with the exception of the addition of thickeners, of increasing the viscosity. The addition of such thickeners would firstly have to be checked for compatibility in each application, which is undesirable in an industrial context.

This STARTING SOLUTION is then subjected to the chosen mechanical after-treatment process and the change in the concentration/viscosity ratio is monitored, either ON-LINE or by ongoing sampling. When the desired value has been achieved (or the measured value is at least close to this) mechanical treatment is stopped. As an alternative, it is also possible, for example, to monitor the molecular weight via GPC or the particle size via light scattering methods.

If the abovementioned processes are carried out a plurality of times for a particular polymer, it is generally possible to dispense with continual monitoring since the treatment time found in the first run is usually very reproducible (cf. example 4).

The SOLUTION obtained in this way is then filtered. In this filtration, attention has to be paid to a variety of technical boundary conditions:

The filtration should be economical, i.e. the filtration rates (e.g., ml or l of SOLUTION/min and filter size) should be in a practicable range. This cannot be limited in terms of specific figures, but will certainly be made understandable to a person skilled in the art by the following: if, for example, 50 l of SOLUTION are to be filtered, the filter elements should be able to be chosen so that the loss of volumes (i.e., for example, dead volume of the filter element, solution for flushing the filter, etc.) add up to not more than 5 l, preferably less than 2 l (i.e. not more than 10%, preferably less than 4%). Furthermore, the filtration should be able to be carried out within an acceptable time interval (for example within a working The filter elements used should be commercially available.

The filter elements used and the associated holders should react very little, preferably not at all, with the SOLUTIONS. This requirement may seem to be trivial, but in practice represents a nontrivial problem. Thus, very many filter elements are made up of polymeric materials and contain adhesives and sealing rings and much more. However, the entire filter element has to be virtually totally resistant to the SOLUTION used. This is usually only the case for elements which consist entirely of fully fluorinated polymers (e.g. PTFE) or exclusively inorganic materials. However, it is frequently possible to make elements which are not totally stable usable by means of an appropriate pretreatment (cf. example 5).

The degree of filtration (i.e. the size of the particles which are filtered out [e.g. with a probability of >99.9%]) has to be practicable for the application while still enabling the abovementioned points (e.g. economic viability) to be met.

It can be useful to circulate the SOLUTION a number of times through the same filter element until, for example, a particle counting method or another method of quality control demonstrates the quality of the filtered SOLUTION.

The filtration per se can in principle be carried out in a variety of apparatuses. Since, however, particular boundary conditions (e.g. preferred treatment of the SOLUTION under an inert atmosphere, avoidance of dust contamination of the filtered SOLUTION) are to be adhered to, the following is appropriate:

It is advisable to use the complete unit (comprising container for SOLUTION, pump system, filter element, container for collection of the filtered SOLUTION including pressure equilibration, any pipes and pump circulation systems) as a closed system in order to make it possible for inert conditions to be obtained efficiently.

It is also advisable to set up the container for the filtered SOLUTION (and any blending or dispensing apparatuses) in a dust-free environment (e.g. clean room).

In the choice of equipment (e.g. pumps, pipes, etc.), attention should be paid, at least in the case of the parts which come into contact with SOLUTION, to their inertness toward the solvents used or the SOLUTIONS.

An apparatus which is in principle suitable for preparing the solutions of the invention can then be as follows:

The container in which the SOLUTION is present is connected via a pipe system to a chemically inert pump. This is in turn connected to an (exchangeable) filter element which finally opens via a further pipe system into a collection vessel. The collection vessel is either provided with sampling facilities or contains probes by means of which the parameters viscosity and concentration can be determined directly on-line. The collection vessel is also possibly connected with a blending unit and a dispensing unit. Dedicated filtration systems can also be installed in each of these.

The entire filtration procedure is carried out at a low admission pressure, preferably in the range from 10 mbar to 3 bar.

It is advantageous for the entire apparatus to be able to be operated under an inert atmosphere.

It is also industrially advantageous for the individual regions of the apparatus to be able to be cleaned independently of one another (e.g. by multiple pumping-through of pure solvents).

The actual filtration can be carried out using, taking into account the abovementioned criteria, a number of filter elements:

Examples of filter elements which can be used are deep bed filters, membrane filters and combi filters; various filter types (which can readily be scaled up) are supplied, for example, by the companies PALL, MILLIPORE, SCHLEICHER & SCHÜLL, SARTORIUS, ULTRAFILTER and further specialist companies.

Usable filter elements can comprise, for example, polypropylene (PP), cellulose, PTFE, PTFE-PFA and similar plastics.

An example of a deep bed filter series which can be used is PALL PROFILE II. This type of filter is obtainable in lengths from 1" to 40" (diameter, for example, 7 cm), in degrees of filtration of from >5 µm to <0.3 µm and with various sealing and connection systems. The filter material is PP, which is virtually inert toward standard solvents after brief initial rinsing.

An example of a membrane filter which can be used is MILLIPORE FLUOROGARD AT or ATX. This filter type is available in sizes of from 4" to 30", in degrees of filtration of from 1 µm to 0.05 µm and with various sealing and connection systems. The filter material is PTFE and PFA and has very good stability toward customary solvents.

As has been stated above, the actual filtration is preferably carried out in a plant suitable for this purpose. Once again, the solution can flow through the actual filter element in various ways. The crossflow process, i.e. the solution moves virtually parallel to the plane of the filter, is one possibility. However, dead-end filtration, i.e. the solution moves virtually perpendicular to the plane of the filter, is also possible. In addition, further filtration methods can be used in the process of the invention.

After the filtration has been carried out in the manner described or in a similar way, the actual process of the invention is complete.

As indicated above, the concentration and viscosity will generally be determined again before use of the solution prepared, since these can easily change during filtration, e.g. as a result of individual polymer particles being held back or due to evaporation of a little solvent. As described, the final concentration and viscosity can then be set by addition of a little filtered solvent.

The resulting filtered solution of polymeric semiconductors can then either be used directly or be packaged, stored, transported (see above) and only used later in another place.

Since the solutions of polymeric semiconductors produced according to the invention are distinguished from the prior art by, in particular, their quality, reproducibility, reliability and storage stability, they are accordingly additional subject matter of the present invention. The invention thus provides solutions of polymeric semiconductors which have been obtained by the above-described process.

Despite the filtration which takes place in the process of the invention, preference is given to allowing the solutions produced according to the invention to run through a filter once again immediately before use. This filter can have a (significantly) larger pore size. It serves as a "point-of-use" filter which eliminates dust which has "sneaked in" after the filtration. A further aspect of the present invention therefore provides for the solutions of the invention to be filtered again directly at the place of use.

As described above, the solutions of the invention can then be used for producing coatings comprising polymeric semiconductors. These have the advantage, especially in comparison with the prior art, of better reproducibility, which is of critical importance for industrial use. The reliability is also generally higher, since the process leads to solutions which have a very low particle content.

The invention therefore also provides for the use of the solutions of the invention for producing layers of polymeric semiconductors.

These layers can be produced with the aid of the solutions of the invention so as to either cover the full area or be structured. Various industrial coating processes can be used for this purpose. For full-area coating, it is possible to use, for example, processes such as doctor blade coating, spin coating, meniscus coating or various printing processes.

Suitable methods for resolved, structured coating are, in particular, various printing processes, e.g. transfer printing, ink jet printing, offset printing, screen printing, to name only a few customary examples.

The invention therefore also provides for the use of the solutions of the invention for producing coatings using coating processes such as doctor blade coating, spin coating, transfer printing, ink jet printing, offset printing or screen printing.

As has likewise been mentioned above, these layers can be used in a variety of applications.

Examples which may be mentioned are the following electronic components: polymeric organic light-emitting diodes (PLEDs), organic integrated circuits (O-ICs), organic field effect transistors (OFETs), organic thin film transistors (OTFTs), organic solar cells (O-SCs) and organic laser diodes (O-lasers).

The invention therefore also provides for the use of the solutions of the invention for producing layers of the invention for use in polymeric organic light-emitting diodes (PLEDs), organic integrated circuits (O-ICs), organic field-effect transistors (OFETs), organic thin film transistors (OT-FTs), organic solar cells (O-SCs) or organic laser diodes (O-lasers).

The present invention is illustrated in more detail by the following examples without being restricted thereto. A person skilled in the art can, on the basis of the description and the examples given, prepare further solutions according to the invention and use them for producing layers without any further inventive step.

EXAMPLE 1

Reproducibility of Polymer Batches 1.1 Batches of Polymer Solids:

7 batches of a yellow-emitting PPV derivative (structure analogous to polymer P6 in EP-A-1029019) were produced in an industrial apparatus (360 l enameled VA vessel, stirrer, reflux condenser, various metering devices, temperature control, nitrogen regulation). After appropriate work-up and purification, the PURE polymers were obtained and were then available for preparing solutions. These polymers had the properties shown in the following table:

1.2 Polymer Solution Batches:

Polymer solutions were then prepared using the above-mentioned batches. The aim was to prepare solutions suitable for spin coating. The prescribed specification was as follows:

| Solvent: | Toluene (MERCK, AR grade #108325) |
|---|---|
| Concentration (w/v): | 4.25 ± 0.25 g/l |
| Viscosity (at 40 $s^{-1}$) | 10.0 ± 1.2 mPa * s |
| Viscosity (at 500 $s^{-1}$) | 9.0 ± 1.0 mPa * s |

The solutions were then prepared as follows:

A 6 l glass flask (with reflux condenser, nitrogen blanketing, precision glass stirrer with magnetic coupling, internal thermometer) was charged with 5 l of toluene and purged with nitrogen for 30 minutes; 25 g (5 g/l) of the respective polymer were subsequently introduced and the mixture was stirred at an internal temperature of about 65° C. for 24 hours. The STARTING SOLUTION prepared in this way was treated mechanically for a particular time (cf. table) in a BANDELIN RK 514BH ultrasonic bath at an internal temperature of about 10° C., subsequently filtered in a clean room (CR class 100) through a PALL PROFILE II filter (0.3 μm, 1", flow rate about 15 ml/min) and subsequently admixed with a small amount of toluene (prefiltered). The solutions obtained in this way were packaged and subsequently used for producing coatings by spin coating. Highly efficient polymeric LEDs were able to be produced from them. The efficiencies and voltages corresponded, within the limits of measurement accuracy, to the values shown in table 1.

Further data on the solutions are shown in the following table:

TABLE 1

Data for the polymer batches P-1 to P-7.

| | Batch | | | | | | |
|---|---|---|---|---|---|---|---|
| | P-1 | P-2 | P-3 | P-4 | P-5 | P-6 | P-7 |
| Viscosity[1] at 40 $s^{-1}$ [mPa * s] | ~25 | ~22 | ~18 | ~26 | ~21 | 25.3 | 10.5 |
| GPC[2]: Mw/1000 | 1495 | 1440 | 1355 | 1615 | 1550 | 1510 | 1250 |
| Mn/1000 | 405 | 420 | 400 | 380 | 420 | 420 | 300 |
| EL[3] (max. eff.; U at 100 Cd/$m^2$) | 12.3 Cd/A 3.2 V | 11.8 Cd/A 3.2 V | 11.9 Cd/A 3.6 V | 12.4 Cd/A 3.2 V | 11.5 Cd/A 3.7 V | 11.1 Cd/A 3.7 V | 11.8 Cd/A 3.7 V |
| EL standard | 10.1 Cd/A 3.7 V | 10.2 Cd/A 3.9 V | 10.4 Cd/A 3.5 V | 10.8 Cd/A 4.0 V | 9.9 Cd/A 3.6 V | 9.9 Cd/A 3.6 V | 10.7 Cd/A 3.7 V |

Remarks:
[1] final purified polymer; 5 g/l in toluene;
[2] GPC measurements: THF; 1 ml/min, Plgel 10 μm mixed B 2 × 300 × 7.5 $mm^2$, 35° C., IR detection was calibrated against polystyrenes;
[3] standard device preparation: as described, for example, in DE 10114477.6 (examples, part C); the standard indicated is tested in parallel to each preparation in order to document the quality of the device production.

TABLE 2

Solutions of the polymers P-1 to P-7.

| | Solution of | | | | | | |
|---|---|---|---|---|---|---|---|
| | P-1[3)] | P-2[4)] | P-3 | P-4[3)] | P-5[3)] | P-6 | P-7 |
| Time of application of ultrasound [min] | 102 | 31 | 20 | 82 | 67 | 35 | 10 |
| Concentration[1)] [g/l] | 4.49 | 4.42 | 4.45 | 4.24 | 4.33 | 4.46 | 4.63 |
| Viscosity[1)] at 40 s$^{-1}$ [mPa * s] | 9.82 | 9.97 | 10.1 | 10.49 | 10.38 | 10.40 | 9.21 |
| Viscosity[1)] at 500 s$^{-1}$ [mPa * s] | 8.95 | 8.85 | 9.15 | 9.55 | 8.83 | 9.38 | 8.56 |
| GPC[2)]: | | | | | | | |
| $M_w$/1000 | 1210 | 1230 | 1240 | 1250 | 1240 | 1230 | 1180 |
| $M_n$/1000 | 380 | 390 | 400 | 380 | 390 | 400 | 300 |

Remarks:
[1)]packaged polymer solution;
[2)]GPC measurements: likewise after packaging; methods as indicated under table 1;
[3)]values are the mean of 9 solution preparations;
[4)]values are the mean of 4 solution preparations.

Comparison of the data in table 1 and table 2 enables the following conclusions to be drawn:

Use of the process of the invention makes it possible, albeit for relatively different polymer batches (cf., for example, P-3 with P-4), to produce uniform solutions having a virtually constant quality (note: the accuracy of, for example, the concentration determination is in the range of ±0.1 g/l, and the reproducibility of viscosity data is likewise at a maximum in the range of ±0.3 mPa*s).

The increase in uniformity is achieved, in particular by the $M_w$ being reduced. This is initially presumably due mainly to destruction of aggregates (cf. example 2).

Without use of a mechanical treatment process, the variation in the viscosity (cf. data in table 1) would be significantly greater.

Only in the case of the outlier batch P-7 was it not possible to meet the tight specification (excessively high concentration); however, this batch, too, made it possible to come very close to the desired range.

EXAMPLE 2

Aggregates in Solutions of Polymeric Semiconductors

As indicated in the description, untreated solutions of polymeric semiconductors frequently contain a high proportion of aggregates. This proportion is significantly reduced by the mechanical treatment (as indicated, for example, in the description or in example 1).

These aggregates can be detected by means of various tests. Two examination methods are used below.

2.1 Filterability of Solutions of Polymeric Semiconductors:

As stated above, untreated solutions of polymeric semiconductors can lead to blocking of filter elements. In this example, a solution of polymer P-1 (cf. example 1) was used and the filterability was observed after different treatment times.

The results are shown in table 3.

2.2 Optical Examination of Solutions of Polymeric Semiconductors:

Particle sizes in solutions can in principle be measured by various scattering methods. In the case of the generally strongly colored solutions of polymeric semiconductors, the method of "noninvasive backscattering" (NIBS) has been found to be useful. A corresponding particle counting apparatus is marketed by ALV. Although this method does not, in our experience, allow absolute particle sizes to be determined, information on tendencies can readily be obtained.

The results are likewise shown in table 3.

For the tests described under 2.1 and 2.2, a solution of polymer P-1 was prepared (in total 10 l; preparation analogous to example 1). The appropriate tests were then carried out without use of ultrasound, after application of ultrasound for 50 minutes and after application of ultrasound for 100 minutes. As filter element, a 1" cartridge as described in example 1 was used.

TABLE 3

Sonication of polymer P-1.

| US time [min] | Filter becomes blocked after[1)] | Filtration rate [ml/min] | NIBS[2)] | | |
|---|---|---|---|---|---|
| | | | Area of polymer peak [%] | Area of middle peak [%] | Area of peak due to aggregates [%] |
| 0 | 100 ml | 3 → 0.2 | 2 | 6 | 92 |
| 50 | ~1000 ml | 15 → 1 | 14 | 20 | 66 |
| 100 | >5 l | constant: 15 | 35 | 20 | 45 |

Remarks:
[1)]a filter is considered to be blocked when the flow rate at a gauge pressure of 50 mbar has dropped significantly below 1 ml/min; >5 l means that this filter did not block at all;
[2)]re the NIBS values: evaluation always gave 3 peaks, of which the smallest was attributed to the dissolved polymer and the largest to the aggregates; it should be noted that the areas reported do not correlate directly with the proportions; in the method used, the measurement signal is proportional to $r^6$ of the corresponding particle, i.e. the method significantly overemphasizes aggregates.

The results indicate the following:

The untreated solutions were difficult to filter.

The number of aggregates was significantly reduced by mechanical treatment.

EXAMPLE 3

Active Reduction in Molecular Weight by Mechanical Treatment

As indicated in the description, some coating processes may make it necessary to set concentration/viscosity ratios which cannot be achieved directly by means of polymers prepared by standard methods. Furthermore, particular uses (e.g. ink jet printing) can prescribe or suggest certain upper limits to the molecular weights because of rheological requirements.

Solutions of polymeric semiconductors were then to be prepared for use in ink jet printing processes.

The solutions should have the following properties:

| | |
|---|---|
| Solvent: | Anisole/o-xylene (1:1) |
| Concentration (w/v): | 14 ± 0.5 g/l |
| Viscosity (at 40 s$^{-1}$) | 10.0 ± 0.6 mPa * s or 15-18 mPa * s |
| Viscosity (at 500 s$^{-1}$) | 10.0 ± 0.6 mPa * s or 15-18 mPa * s |

Both a solution of a yellow-emitting PPV derivative and of a blue-emitting polyspirofluorene derivative were then to be prepared.

The polymer P-7 (cf. example 1) and the polymer P-8 (blue-emitting polyspiro derivative, structure analogous to polymer P12 in DE 10114477.6) were used.

The preparation of the solution was initially carried out in a manner analogous to example 1, but significantly longer ultrasonication times were used.

The effect of sonication was monitored via measurement of the viscosity. At the end, a GPC analysis of the solutions was also carried out. The results are summarized in the following tables:

TABLE 4

Sonication of polymer P-7.

| Ultrasonication time [h][1] | mPa * s at 40 s$^{-1}$ | mPa * s at 500 s$^{-1}$ |
|---|---|---|
| 0 | 327 | 133 |
| 12 | 194 | 110 |
| 22 | 120 | 88 |
| 30 | 82 | 68 |
| 41 | 33 | 30 |
| 52 | 20 | 18.5 |
| 59 | 17 | 17 |

TABLE 4-continued

Sonication of polymer P-7.

| GPC values[2] | $M_w$/1000 | $M_n$/1000 |
|---|---|---|
| 0 h US | 1180 | 300 |
| 59 h US | 350 | 150 |

Remarks:
[1] the mechanical treatment was carried out for the first 30 hours in an ultrasonic bath (cf. example 1), and for the remaining time the treatment was continued using an ultrasonic probe BRANSON SONIFIER 450 DIGI;
[2] GPC procedure as described in example 1.

TABLE 5

Sonication of polymer P-8.

| Ultrasonication time [h][1] | mPa * s at 40 s$^{-1}$ | mPa * s at 500 s$^{-1}$ |
|---|---|---|
| 0 | 115 | 57 |
| 8 | 15 | 15 |
| 14 | 11.8 | 11.8 |
| 17 | 11.0 | 11.0 |
| 22 | 9.9 | 9.9 |

| GPC values[2] | $M_w$/1000 | $M_n$/1000 |
|---|---|---|
| 0 h US | 1220 | 260 |
| 22 h US | 560 | 260 |

Remarks:
[1] the mechanical treatment was here carried out exclusively in an ultrasonic bath (cf. example 1);
[2] GPC procedure as described in example 1.

Structured PLEDs could be produced by ink jet printing from the solutions prepared in this way. The solutions were printed, for example, using a Spectra Galaxy 256/80 or 256/20 printing head.

The following can be seen from the results:

The process of the invention also makes it possible to obtain solutions of polymeric semiconductors which have unusual concentration/viscosity ratios.

The mechanical treatment makes a controlled reduction in the molecular weight possible.

Solutions which have been treated mechanically for a relatively long time behave as ideal NEWTON solutions (i.e. the viscosity remains constant regardless of the shear applied).

EXAMPLE 4

Reproducibility of the Process of the Invention

As emphasized a number of times in the description, the reproducibility is frequently of critical importance for industrial processes. In the present context, this means, firstly, the preparation of a very constant solution quality and, secondly, a very high constancy of the production parameters.

This is demonstrated by the following experiment:

As indicated in example 1 (1.2, table 2) for a number of polymers, the data reported there are the means of a plurality of solution preparations. This is described in more detail below for the polymer P-4.

A total of 9 solutions (prepared in a manner analogous to example 1) were employed for this purpose. The amounts of solution varied from 5 to 15 l.

The values achieved are shown in the following table:

TABLE 6

Reproducibility of constant solution quality for polymer P-4.

| | | | | Viscosity[2] | | EL data[3] | | | |
|---|---|---|---|---|---|---|---|---|---|
| Solution number | Initial conc. [g/l][1] | US time [h] | Final conc. [g/l][1] | at 40 s$^{-1}$ [mPas] | at 500 s$^{-1}$ [mPas] | max. eff. [Cd/A] | U [V] at 100 Cd/m$^2$ | Ref. eff. [Cd/A] | Ref. U [V] |
| P-4-01 | 4.96 | 0.75 | 4.32 | 9.78 | 9.52 | 11.8 | 3.2 | 10.5 | 3.4 |
| P-4-02 | 4.98 | 1 | 4.26 | 10.80 | 9.34 | 10.4 | 3.2 | 9.7 | 3.5 |
| P-4-03 | 5.04 | 1.6 | 4.26 | 10.50 | 8.97 | 10.6 | 3.4 | 9.7 | 3.7 |
| P-4-04 | 4.96 | 1.5 | 4.19 | 10.20 | 9.45 | 11.8 | 3.2 | 10.1 | 3.7 |
| P-4-05 | 5.01 | 1.5 | 4.23 | 10.60 | 9.82 | 10.9 | 3.2 | 10.7 | 3.4 |
| P-4-06 | 4.97 | 1.5 | 4.21 | 10.20 | 9.71 | 11.3 | 3.4 | 9.7 | 3.9 |
| P-4-07 | 4.98 | 1.5 | 4.25 | 10.60 | 10.00 | 11.1 | 3.4 | 9.8 | 3.9 |
| P-4-08 | 5.03 | 1.5 | 4.26 | 10.60 | 9.93 | 12.3 | 3.2 | 9.8 | 3.9 |
| P-4-09 | 5.09 | 1.5 | 4.21 | 11.14 | 9.23 | 10.78 | 3.2 | 9.67 | 3.65 |
| Means | 5.00 | 1.37 | 4.24 | 10.49 | 9.55 | 11.22 | 3.27 | 9.96 | 3.67 |

Remarks:
[1] initial concentration is the actual concentration in the STARTING SOLUTION; final concentration is that of the filtered and diluted solution;
[2] viscosity data for the filtered and diluted solution;
[3] EL measurements: analogous to example 1, table 1, in each case determined for the individual solutions; reference sample likewise as indicated above.

EXAMPLE 5

Stability of Filter Elements Used

As stated in the description, it is important that no impurities are introduced into the solutions of polymeric semiconductors by the various operations. In the process steps "dissolution", "mechanical treatment" and "dilution & packaging & storage", this can generally be achieved without problems by appropriate selection of media (e.g. electropolished stainless steel, glass or fused silica vessels, or enameled vessels, or PTFE/PFA-coated apparatuses). In the case of filtration, the situation is somewhat different, since there are at present only a limited number of solvent-stable commercial filter elements. Apart from some elements (very expensive all-PTFE/PFA elements), recourse therefore frequently has to be made to elements which are not totally stable. That this is nevertheless possible under suitable conditions, is demonstrated by this example:

The filter type PALL PROFILE II which is frequently used in the above examples consists entirely of polypropylene (PP). Seals made of FEP-sheathed VITON can be obtained. The seals thus have a good resistance to solvents. However, PP is not totally stable.

However, the following has been discovered: on contact with solvents, the filter elements release a certain amount of material. However, this does not alter the filter consistency. In addition, the release of material is strongly time-dependent. The material released was able to be identified unambiguously as PP having a relatively low molecular weight ($^1$H NMR, GPC, comparison with reference samples).

The tests were carried out as follows:

Five solutions were produced in parallel by placing filter material (in each case 100 g) in solvent (in this case toluene) at room temperature (25° C.) for a particular time (see table). After the time had expired, the solvent was evaporated, the amount of extract was determined and the extract was in each case analyzed by NMR and GPC. Furthermore, some of the filter samples were additionally examined for changes by electron microscopy.

The results are summarized in the following table:

TABLE 7

Extraction tests on PALL PROFILE II filter elements; here parts of 10", 0.5 μm cartridges.

| Time | Amount of extract [mg] | Identification of extract | Filter after extraction (EM)[1] |
|---|---|---|---|
| 10 min | 80 mg | PP, $M_w$ ~5000 | no change |
| 30 min | 180 mg | PP, $M_w$ ~5000 | no change |
| 1 h | 220 mg | PP, $M_w$ ~5000 | no change |
| 24 h | 245 mg | PP, $M_w$ ~5000 | no change |
| 72 h | 250 mg | PP, $M_w$ ~5000 | no change |

Remarks:
[1] the electron micrographs (EM) were compared with a comparative sample from an untreated filter.

This experiment indicates the following:
After only about 1 hour, virtually all soluble material has been leached from the filter.
The filter consistency is maintained even after long exposure to solvent.
To avoid or minimize contamination of the solutions with low molecular weight PP, it is advisable to rinse the filters with pure solvent for about 1 hour before use (this was also done in the tests in examples 1 to 4).
This method can make it possible to use even filter types which are not totally stable for the preparation of solutions according to the invention.

EXAMPLE 6

Storage Stability of Solutions Produced According to the Invention

To check whether the solutions produced according to the invention can be stored for a prolonged period, the following experiment was carried out:

A solution of polymer P-9 (polymer analogous to the polymers P-1 to P-7; preparation of the solution in toluene in a manner analogous to example 1) was dispensed into a 1 l bottle from ATMI Packaging (NOW-NP-01-A-GC). This bottle was placed in an aluminized PE bag (ALDRICH # Z18340-7), the bag was filled with argon and welded shut. The bottle was stored at room temperature in a solvent cabinet. At defined intervals (cf. table 8), a small sample was taken from this bottle in a clean room, and this sample was examined to determine the concentration, viscosity and use properties in a PLED. The bottle was subsequently resealed. The results obtained are summarized in the following table.

TABLE 8

Storage stability of a toluene solution of polymer P-9 produced according to the invention.

| Sequential number | Day[1] | conc. [g/L] | Viscosity at 40 s$^{-1}$ [mPas] | EL data[2] | | | |
|---|---|---|---|---|---|---|---|
| | | | | max. eff. [Cd/A] | U [V] at 100 Cd/m$^2$ | Ref. eff. Cd/A] | Ref. U [V] |
| #1 | 0 | 5.19 | 13.8 | 9.82 | 3.3 | 10.2 | 3.4 |
| #2 | 30 | 5.12 | 13.5 | 10.77 | 3.3 | 10.5 | 3.6 |
| #3 | 59 | 5.05 | 13.5 | 10.10 | 3.7 | 10.7 | 3.5 |
| #4 | 86 | 5.25 | 14.4 | 10.43 | 3.2 | 10.4 | 3.6 |
| #5 | 122 | 5.12 | 14.3 | 10.40 | 3.4 | 10.9 | 3.5 |
| #6 | 147 | 5.17 | 15.0 | 10.10 | 3.4 | 11.2 | 3.4 |
| #7 | 175 | 5.14 | 14.3 | 9.80 | 3.4 | 10.0 | 3.6 |
| #8 | 215 | 5.12 | 14.5 | 10.20 | 3.4 | 10.5 | 3.9 |
| #9 | 317 | 5.19 | 15.6 | 9.90 | 3.2 | 9.7 | 3.7 |
| #10 | 390 | 5.25 | 13.9 | 10.01 | 3.1 | 11.2 | 3.2 |
| ø | — | 5.16 | 14.3 | 10.15 | 3.3 | 10.5 | 3.5 |

Remarks:
[1] time since first packaging and sealing in bottle.
[2] EL measurements: analogous to example 1, table 1, in each case determined for the individual samples; reference sample likewise as indicated above.

The results reported enable the following conclusion to be drawn:

within the limits of measurement accuracy, the solution of the invention can be stored without changes in concentration, viscosity and usability for PLED production for more than one year.

The invention claimed is:

1. A process for preparing solutions comprising polymeric organic semiconductors, which comprises the steps:
   A) dissolution of at least one polymeric organic semiconductor in a suitable solvent (STARTING SOLUTION),
   B) after-treatment of the STARTING SOLUTION from step A) (SOLUTION),
   C) filtration of the SOLUTION from step B) by means of dead-end filtration and/or crossflow filtration and isolation of the filtered solution comprising at least one polymeric organic semiconductor (FILTERED SOLUTION).

2. The process as claimed in claim 1, wherein a mixture of a plurality of polymeric organic semiconductors (polymer blend), and optionally in combination with one or more low molecular weight additives, is used in step A).

3. The process as claimed in claim 1, characterized in that a solvent mixture is used in step A).

4. The process as claimed in claim 1, wherein the polymeric organic semiconductor is dissolved in the solvent (step A) by action of shear forces.

5. The process as claimed in claim 1, wherein the solution from step A) still comprises dispersion-like constituents.

6. The process as claimed in claim 1, wherein the after-treatment of the solution from step A) is carried out by means of one or more mechanical after-treatment(s).

7. The process as claimed in claim 6, characterized in that the mechanical after-treatment is carried out by means of ultrasound, a fast-running, high-shear dispersing stirrer and/or a disintegrator.

8. The process as claimed in claim 1, wherein the solution obtained in step B) is prefiltered before the filtration in step C).

9. The process as claimed in claim 1, wherein the solution obtained in step C) is filtered by means of further filtration methods.

10. The process as claimed in claim 1, wherein the concentration/viscosity ratio of the FILTERED SOLUTION obtained in step C) is adjusted by addition of solvent or solvent mixture.

11. The process as claimed in claim 1, wherein step A), step B) and/or step C), are carried out under an inert atmosphere.

12. The process as claimed in claim 10, characterized in that the filtration in step C) and the addition of the solvent or the solvent mixture are carried out in a clean-room environment.

13. The process as claimed in claim 1, wherein the solution obtained in step C) is packaged in containers suitable for clean-room conditions.

14. The process as claimed in claim 13, characterized in that the packaged solution is blanketed with an inert atmosphere.

15. The process as claimed in claim 1, wherein the after-treatment in step B) reduces the molecular weight of the polymeric organic semiconductor.

16. The process as claimed in claim 1, wherein a deep bed filter and/or membrane filter is used in step C).

17. A solution of polymeric semiconductors which is prepared as claimed in claim 1.

18. A polymeric organic light-emitting diode (PLED), organic integrated circuit (O-IC), organic field effect transistor (OFET), organic thin film transistor (OTFT), organic solar cell (O-SC) or organic laser diode (O-laser) produced using a solution as claimed in claim 17.

19. The process as claimed in claim 4, wherein the polymeric organic semiconductor is dissolved in the solvent (step A) by stirring or mixing, and optionally with heating.

20. The process as claimed in claim 1, wherein all steps A), step B) and step C) are carried out under an inert atmosphere.

21. The process as claimed in claim 11, wherein the filtration in step C) and the addition of the solvent or the solvent mixture are carried out in a clean-room environment of class 100.

22. The process as claimed in claim 11, wherein the filtration in step C) and the addition of the solvent or the solvent mixture are carried out in a clean-room environment of class 10.

23. A process for producing layers of polymeric semiconductors which comprises using the solution as claimed in claim 17.

24. The process as claimed in claim 23, wherein the process is a coating process.

25. The process as claimed in claim 24, wherein the coating processes is a doctor blade coating, spin coating, meniscus coating, transfer printing, ink jet printing, offset printing or screen printing process.

* * * * *